United States Patent
Liu et al.

(10) Patent No.: US 11,768,230 B1
(45) Date of Patent: Sep. 26, 2023

(54) CURRENT SENSOR INTEGRATED CIRCUIT WITH A DUAL GAUGE LEAD FRAME

(71) Applicant: Allegro MicroSystems, LLC, Manchester, NH (US)

(72) Inventors: Shixi Louis Liu, Hooksett, NH (US); Maxwell McNally, Manchester, NH (US); Alexander Latham, Harvard, MA (US)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 17/657,135

(22) Filed: Mar. 30, 2022

(51) Int. Cl.
*G01R 15/20* (2006.01)
*H10N 52/01* (2023.01)
*H10N 52/80* (2023.01)
*H10N 52/00* (2023.01)

(52) U.S. Cl.
CPC .......... *G01R 15/207* (2013.01); *H10N 52/01* (2023.02); *H10N 52/101* (2023.02); *H10N 52/80* (2023.02)

(58) Field of Classification Search
CPC ..... G01R 15/207; H01L 43/04; H01L 43/065; H01L 43/14
See application file for complete search history.

(56) References Cited

U.S. PATENT DOCUMENTS

| | | |
|---|---|---|
| 4,425,596 A | 1/1984 | Satou |
| 4,893,073 A | 1/1990 | McDonald et al. |
| 5,037,316 A | 8/1991 | Fukushima et al. |
| 5,041,780 A | 8/1991 | Rippel |
| 5,124,642 A | 6/1992 | Marx |

(Continued)

FOREIGN PATENT DOCUMENTS

| | | |
|---|---|---|
| CN | 1412843 A | 4/2003 |
| CN | 1842711 A | 10/2006 |

(Continued)

OTHER PUBLICATIONS

U.S. Appl. No. 17/409,011, filed Aug. 23, 2021, Rock, et al.

(Continued)

*Primary Examiner* — Dominic E Hawkins
(74) *Attorney, Agent, or Firm* — DALY, CROWLEY, MOFFORD & DURKEE, LLP

(57) ABSTRACT

A current sensor IC includes a unitary lead frame having a primary conductor with a first thickness and a secondary lead having a second thickness less than the first thickness. A semiconductor die adjacent to the primary conductor includes a magnetic field sensing circuit to sense a magnetic field associated with the current and generate a secondary signal indicative of the current. An insulation structure is disposed between the primary conductor and the die. A mold material encloses a first portion of the secondary lead and a second portion of the secondary lead that is exposed outside of the package has the second thickness. A method of manufacturing a current sensor IC includes providing a unitary lead frame sheet having a first thickness, decreasing a thickness of a portion of the sheet to provide a first portion with the first thickness and a second portion with a smaller thickness, and stamping the sheet to form a repeating lead frame pattern, with each pattern including a primary conductor formed from the first portion and secondary leads formed from the second portion.

24 Claims, 9 Drawing Sheets

(56) References Cited

U.S. PATENT DOCUMENTS

| | | | |
|---|---|---|---|
| 5,247,202 A | 9/1993 | Popovic et al. | |
| 5,442,228 A | 8/1995 | Pham et al. | |
| 5,561,366 A | 10/1996 | Takahashi et al. | |
| 5,615,075 A | 3/1997 | Kim | |
| 6,005,383 A | 12/1999 | Savary et al. | |
| 6,150,714 A | 11/2000 | Andreycak et al. | |
| 6,252,389 B1 | 6/2001 | Baba et al. | |
| 6,316,931 B1 | 11/2001 | Nakagawa et al. | |
| 6,323,634 B1 | 11/2001 | Nakagawa et al. | |
| 6,356,068 B1 | 3/2002 | Steiner et al. | |
| 6,411,078 B1 | 6/2002 | Nakagawa et al. | |
| 6,424,018 B1 | 7/2002 | Ohtsuka | |
| 6,445,171 B2 | 9/2002 | Sandquist et al. | |
| 6,462,531 B1 | 10/2002 | Ohtsuka | |
| 6,545,456 B1 | 4/2003 | Radosevich et al. | |
| 6,566,856 B2 | 5/2003 | Sandquist et al. | |
| 6,583,572 B2 | 6/2003 | Veltrop et al. | |
| 6,642,705 B2 | 11/2003 | Kawase | |
| 6,667,682 B2 | 12/2003 | Wan et al. | |
| 6,683,448 B1 * | 1/2004 | Ohtsuka | H01L 43/065 257/E43.003 |
| 6,727,683 B2 | 4/2004 | Goto et al. | |
| 6,759,841 B2 | 7/2004 | Goto et al. | |
| 6,781,359 B2 | 8/2004 | Stauth et al. | |
| 6,791,313 B2 | 9/2004 | Ohtsuka | |
| 6,812,687 B1 | 11/2004 | Ohtsuka | |
| 6,841,989 B2 | 1/2005 | Goto et al. | |
| 6,853,178 B2 | 2/2005 | Hayat-Dawoodi | |
| 6,867,573 B1 | 3/2005 | Carper | |
| 6,921,955 B2 | 7/2005 | Goto | |
| 6,989,665 B2 | 1/2006 | Goto | |
| 6,995,315 B2 | 2/2006 | Sharma et al. | |
| 7,006,749 B2 | 2/2006 | Illich et al. | |
| 7,075,287 B1 | 7/2006 | Mangtani et al. | |
| 7,166,807 B2 | 1/2007 | Gagnon et al. | |
| 7,248,045 B2 | 7/2007 | Shoji | |
| 7,259,545 B2 | 8/2007 | Stauth et al. | |
| 7,265,531 B2 | 9/2007 | Stauth et al. | |
| 7,348,724 B2 | 3/2008 | Lee | |
| 7,358,724 B2 | 4/2008 | Taylor et al. | |
| 7,476,816 B2 | 1/2009 | Doogue et al. | |
| 7,476,953 B2 | 1/2009 | Taylor et al. | |
| 7,598,601 B2 | 10/2009 | Taylor et al. | |
| 7,709,754 B2 | 5/2010 | Doogue et al. | |
| 7,768,083 B2 | 8/2010 | Doogue et al. | |
| 8,080,994 B2 | 12/2011 | Taylor et al. | |
| 8,680,843 B2 | 3/2014 | Ausserlechner | |
| 8,760,149 B2 | 6/2014 | Ausserlechner | |
| 8,860,153 B2 | 10/2014 | Ausserlechner et al. | |
| 8,907,437 B2 | 12/2014 | Milano et al. | |
| 9,190,606 B2 * | 11/2015 | Liu | H01L 21/4828 |
| 9,865,807 B2 | 1/2018 | Liu et al. | |
| 10,345,343 B2 | 7/2019 | Milano et al. | |
| 10,753,963 B2 | 8/2020 | Milano et al. | |
| 2001/0028115 A1 | 10/2001 | Yanagawa et al. | |
| 2002/0179987 A1 | 12/2002 | Meyer et al. | |
| 2003/0071333 A1 | 4/2003 | Matsuzawa | |
| 2003/0155634 A1 | 8/2003 | Yasunaga et al. | |
| 2004/0056647 A1 | 3/2004 | Stauth et al. | |
| 2004/0080307 A1 | 4/2004 | Ohtsuka | |
| 2004/0080308 A1 | 4/2004 | Goto | |
| 2004/0113280 A1 | 6/2004 | Kim | |
| 2004/0155644 A1 | 8/2004 | Stauth et al. | |
| 2005/0029638 A1 | 2/2005 | Ahn et al. | |
| 2005/0030018 A1 | 2/2005 | Shibahara et al. | |
| 2005/0045359 A1 | 3/2005 | Doogue et al. | |
| 2005/0139982 A1 | 6/2005 | Fukaya et al. | |
| 2005/0224248 A1 | 10/2005 | Gagnon et al. | |
| 2005/0230843 A1 | 10/2005 | Williams | |
| 2006/0002147 A1 | 1/2006 | Hong et al. | |
| 2006/0071655 A1 | 4/2006 | Shoji | |
| 2006/0091993 A1 | 5/2006 | Shoji | |
| 2006/0114098 A1 | 6/2006 | Shoji | |
| 2006/0145690 A1 | 7/2006 | Shoji | |
| 2006/0170529 A1 | 8/2006 | Shoji | |
| 2006/0181263 A1 | 8/2006 | Doogue et al. | |
| 2006/0219436 A1 | 10/2006 | Taylor et al. | |
| 2006/0291106 A1 | 12/2006 | Shoji | |
| 2007/0044370 A1 | 3/2007 | Shoji | |
| 2007/0076332 A1 | 4/2007 | Shoji et al. | |
| 2007/0090825 A1 | 4/2007 | Shoji | |
| 2007/0096716 A1 | 5/2007 | Shoji | |
| 2007/0170533 A1 | 7/2007 | Doogue et al. | |
| 2007/0188946 A1 | 8/2007 | Shoji | |
| 2007/0279053 A1 | 12/2007 | Taylor et al. | |
| 2008/0297138 A1 | 12/2008 | Taylor et al. | |
| 2009/0206833 A1 | 8/2009 | Imai et al. | |
| 2010/0156394 A1 | 6/2010 | Ausserlechner et al. | |
| 2010/0258921 A1 | 10/2010 | Chang Chien et al. | |
| 2011/0221429 A1 | 9/2011 | Tamura | |
| 2011/0248392 A1 | 10/2011 | Javier et al. | |
| 2011/0248711 A1 | 10/2011 | Ausserlechner | |
| 2011/0304327 A1 | 12/2011 | Ausserlechner | |
| 2011/0316149 A1 | 12/2011 | Suzuki et al. | |
| 2013/0020660 A1 | 1/2013 | Milano et al. | |
| 2013/0049746 A1 | 2/2013 | Strutz et al. | |
| 2014/0151697 A1 | 6/2014 | Ausserlechner et al. | |
| 2014/0167736 A1 | 6/2014 | Suzuki et al. | |
| 2014/0264678 A1 * | 9/2014 | Liu | H01L 43/065 257/427 |
| 2016/0028001 A1 | 1/2016 | Liu et al. | |
| 2016/0282388 A1 * | 9/2016 | Milano | G01R 19/0092 |
| 2017/0138988 A1 | 5/2017 | Ausserlechner | |
| 2020/0132728 A1 * | 4/2020 | Boury | G01R 15/148 |

FOREIGN PATENT DOCUMENTS

| | | |
|---|---|---|
| CN | 103649762 A | 3/2014 |
| DE | 4 141 386 | 6/1993 |
| DE | 10 2008 034 577 | 2/2010 |
| EP | 0 867 725 | 9/1998 |
| EP | 1 107 327 | 6/2001 |
| EP | 1 107 328 | 6/2001 |
| EP | 1 111 693 | 6/2001 |
| EP | 1 180 804 | 2/2002 |
| EP | 1 281 974 | 2/2003 |
| JP | 61-71649 | 4/1986 |
| JP | 63-191069 | 8/1988 |
| JP | 4-364472 | 12/1992 |
| JP | H06140555 A | 5/1994 |
| JP | H06260582 A | 9/1994 |
| JP | H07-147360 A | 6/1995 |
| JP | H 08-211138 | 8/1996 |
| JP | 2000174357 | 6/2000 |
| JP | 2001165963 | 6/2001 |
| JP | 2001174486 | 6/2001 |
| JP | 2001221815 | 8/2001 |
| JP | 2001230467 | 8/2001 |
| JP | 2001339109 | 12/2001 |
| JP | 2002026419 | 1/2002 |
| JP | 2002040058 | 2/2002 |
| JP | 2002202326 | 7/2002 |
| JP | 2002202327 | 7/2002 |
| JP | 2002267692 | 9/2002 |
| JP | 2003-098196 A | 4/2003 |
| JP | 2003-124421 A | 4/2003 |
| JP | 2003130895 | 5/2003 |
| JP | 2003-172750 | 6/2003 |
| JP | 2003-188331 | 7/2003 |
| JP | 2003329749 | 11/2003 |
| JP | 2005-198760 A | 7/2005 |
| JP | 2006186075 A | 7/2006 |
| JP | 2007-503584 A | 2/2007 |
| JP | 2011017713 | 1/2011 |
| JP | 2011069837 | 4/2011 |
| JP | 2011075576 | 4/2011 |
| WO | WO 99/14605 | 3/1999 |
| WO | WO 03/038452 | 5/2003 |
| WO | WO 2005/026749 | 3/2005 |
| WO | WO 2006/130393 | 12/2006 |
| WO | WO 2010103934 | 9/2010 |
| WO | WO 2013/015976 A1 | 1/2013 |
| WO | WO 2013/008462 A1 | 2/2015 |

(56) References Cited

FOREIGN PATENT DOCUMENTS

OTHER PUBLICATIONS

U.S. Appl. No. 17/654,254, filed Mar. 10, 2022, Boden, et al.
3M Electrical Markets Product Brochure "Electrical, Electronic and EMI, Shielding Tapes Selection Guide", 2007, 12 pages.
Allegro Datasheet ACS712, Fully Integrated, Hall Effect-Based Linear Current Sensor IC with 2.1 kVRMS Isolation and a Low-Resistance Current Conductor, 2006, 14 pages.
Allegro Datasheet ACS758xCB, Thermally Enhanced, Fully Integrated, Hall Effect-Based Linear Current Sensor IC with 100 $\mu\Omega$ Current Conductor, 2008, 19 pp.
Clemson University Vehicular Electronics Laboratory; "Electromagnetic Compatibility;" internet: http://www.cvel.clemson.edu/emc/tutorials/Shielding02/Practical_Shielding.html; Dec. 22, 2009; 9 Pages.
Lee et al.; "Fine Pitch Au—SnAgCu Joint-in-via Flip-Chip Packaging;" IEEE $9^{th}$ Electronics Packaging Technology Conference, 2007; 7 Pages.
Mosbarger et al.; "The Effects of Materials and Post-Mold Profiles on Plastic Encapsulated Integrated Circuits;" IEEE/IRPS; 1994; 8 pages.
Steiner et al. "Fully Packaged CMOS Current Monitor Using Lead-On-Chip Technology" Physical Electronics Laboratory, ETH Zurich, CH-8093, Switzerland, 0-7803-4412 X98, IEEE 1998, 6 pages.
Underwriters Laboratories Inc. (UL), UL Standard for Safety for Information Technology Equipment—Safety—Part 1: General Requirements, UL 60950-1, Second Edition, dated Mar. 27, 2007, 275 pages.
Underwriters Laboratories Inc. (UL), UL Standard for Safety for Information Technology Equipment—Safety—Part 2: General Requirements, UL 60950-1, Second Edition, dated Mar. 27, 2007, 233 pages.
Wikipedia; "Electromagnetic Field;" internet: http://en.wikipedia.org/wiki/Electromagnetic_field; Dec. 22, 2009; 7 sheets.
Wikipedia; "Electromagnetic Shielding;" internet: http://en.wikipedia.org/wiki/Electromagnetic_shielding; Dec. 22, 2009; 3 pages.
Wikipedia; "Magnetic Field;" internet: http://en.wikipedia.org/wiki/Magnetic_field; Dec. 22, 2009; 25 pages.
Preliminary Amendment dated Feb. 21, 2012 for U.S. Appl. No. 13/188,739; 73 pages.
Restriction Requirement dated Jun. 27, 2013 for U.S. Appl. No. 13/188,739; 7 pages.
Response to Restriction Requirement dated Jun. 28, 2013 for U.S. Appl. No. 13/188,739; 1 page.
Office Action dated Aug. 16, 2013 for U.S. Appl. No. 13/188,739; 15 pages.
Amendment dated Oct. 23, 2013 for U.S. Appl. No. 13/188,739; 11 pages.
Final Office Action dated Jan. 10, 2014 for U.S. Appl. No. 13/188,739; 15 pages.
Amendment and RCE dated Apr. 11, 2014 for U.S. Appl. No. 13/188,739; 10 pages.
Notice of Allowance dated Oct. 3, 2014 for U.S. Appl. No. 13/188,739; 7 pages.
Search Report and Written Opinion dated Nov. 27, 2012 for PCT Application No. PCT/US2012/046025; 11 pages.
International Preliminary Report on Patentability dated Feb. 6, 2014 for PCT Application No. PCT/US2012/046025; 8 pages.
Japanese Office Action with English translation dated Oct. 23, 2015 for Japanese Application No. 2014-521652; 10 pages.
Response to Japanese Office Action filed on Jan. 8, 2016 with pending claims and letter to Yuasa and Hara dated Dec. 8, 2015 for Japanese Application No. 2014-521652; 12 pages.
Japanese Office Action with English translation dated Jun. 30, 2016 for Japanese Application No. 2014521652; 5 pages.
German Office Action with English Translation dated Dec. 1, 2017 for German Application No. 112012003079.6, 18 pages.
Response (with English Translation) to German Office Action dated Dec. 1, 2017 for German Application No. 112012003079.6; Response filed on Apr. 6, 2018; 116 pages.
Japanese Office Action ( with English translation) dated Sep. 15, 2017 for Japanese Application No. 2016-209261; 13 pages.
Letter to Yuasa and Hara dated Nov. 17, 2017 for Japanese Application No. 2016-209261; 9 pages.
Japanese Response to Office Action with English claims dated Dec. 14, 2017 for Japanese Application No. 2016-209261; 14 pages.
Japanese Office Action (with English Translation) dated May 9, 2018 for Japanese Application No. 2016209261; 6 Pages.
Japanese Response with English Translations of Amended Claims for Japanese Application No. 2016-209261 as filed on Aug. 3, 2018; 14 Pages.
Office Action dated Oct. 9, 2018 for Japanese Application No. 2016-209261 with English Translation; 5 Pages.
Response to Office Action dated Oct. 9, 2018 for Japanese Application No. 2016-209261 as filed on Oct. 18, 2018 with English Translation of Claims; 14 Pages.
Notice of Allowance dated Oct. 30, 2018 for Japanese Application No. 2016-209261 with English Translation of Allowed Claims; 10 Pages.
Restriction Requirement dated Sep. 17, 2014 for U.S. Appl. No. 13/834,617; 6 pages.
Response to Restriction Requirement dated Nov. 18, 2014 for U.S. Appl. No. 13/834,617; 1 page.
Office Action dated Jan. 9, 2015 for U.S. Appl. No. 13/834,617; 11 pages.
Amendment dated May 7, 2015 for U.S. Appl. No. 13/834,617; 13 pages.
Notice of Allowance dated Aug. 28, 2015 for U.S. Appl. No. 13/834,617; 8 pages.
Search Report and Written Opinion dated Jun. 2, 2014 for PCT Application No. PCT/US2014/018525; 13 pages.
International Preliminary Report on Patentability dated Sep. 24, 2015 for PCT Application No. PCT/US2014/018525; 10 pages.
Response to Written Opinion filed on Apr. 18, 2016 for European Application No. 14709845.3; 14 pages.
European Search Report dated May 17, 2018 for European Application No. 14709845.3; 7 Pages.
Response to European Office Action dated May 17, 2018, for European Application No. 14709845.3 as filed on Sep. 27, 2018; 11 Pages.
Examination Report dated May 27, 2020 for European Application No. 14709845.3; 7 Pages.
Japanese Office Action (with English translation) dated Oct. 3, 2017 for Japanese Application No. 2016-500401; 8 pages.
Japanese Response to Office Action with English claims dated Dec. 25, 2017 for Japanese Application No. 2016-500401, 11 pages.
Japanese Office Action with English Translation dated Mar. 5, 2018 for Japanese Application No. JP 2016-500401; 13 pages.
Response (with English amended claims) to Japanese Office Action dated Mar. 5, 2018 for Japanese Application No. 2016-500401; Response filed Jun. 5, 2018; 12 Pages.
Japanese Office Action with English Translation dated Sep. 11, 2018, for Japanese Application No. 2016-500401; 9 Pages.
Korean Office Action (with Machine English Translation) dated Jan. 2, 2020 for Korean Application No. 10-2015-7029244; 13 Pages.
Response (with Machine English Translation) to Korean Office Action dated Jan. 2, 2020 for Korean Application No. 10-2015-7029244; Response filed Feb. 27, 2020; 54 Pages.
Korean Notice of Allowance (with English Translation) dated Jul. 20, 2020 for Korean Application No, 10-2015-7029244; 9 Pages.
U.S. Non-Final Office Action dated Jan. 30, 2017 for U.S. Appl. No. 14/877,309; 10 pages.
Response to U.S. Non-Final Office Action dated Jan. 30, 2017 for U.S. Appl. No. 14/877,309; Response filed on Apr. 14, 2017; 7 Pages.
Notice of Allowance dated Oct. 24, 2017 for U.S. Appl. No. 14/877,309; 9 pages.
Japanese Notice of Reason for Rejection (with English Translation) dated Jan. 22, 2020 for Japanese Application No. 2018-229511; 7 Pages.

(56) References Cited

OTHER PUBLICATIONS

Response (with Machine English Translation) to Japanese Office Action dated Jan. 22, 2020 for Japanese Application No. 2018-229511; Response filed Mar. 24, 2020; 13 Pages.
Japanese Decision to Grant (with Machine English Translation & Allowed Claims) dated Mar. 30, 2020 for Japanese Application No. 2018-229511; 10 Pages.
Restriction Requirement dated Jan. 13, 2017 for U.S. Appl. No. 15/179,147, 6 pages.
Response to Restriction Requirement filed on Jan. 26, 2017 for U.S. Appl. No. 15/179,147, 1 page.
Office Action dated Sep. 14, 2017 for U.S. Appl. No. 15/179,147, 16 pages.
Response to Office Action filed on Dec. 8, 2017 for U.S. Appl. No. 15/179,147, 14 pages.
Final Office Action dated May 3, 2018 for U.S. Appl. No. 15/179,147, 20 pages.
Request for Continued Examination filed on Jun. 28, 2018 for U.S. Appl. No. 15/179,147, 3 pages.
Response to Final Office Action filed on Jun. 28, 2018 for U.S. Appl. No. 15/179,147, 11 pages.
Office Action dated Dec. 11, 2018 for U.S. Appl. No. 15/179,147, 7 pages.
Response to Office Action filed on Dec. 26, 2018 for U.S. Appl. No. 15/179,147, 8 pages.
Notice of Allowance dated Apr. 23, 2019 for U.S. Appl. No. 15/179,147, 30 pages.
Office Action dated Feb. 24, 2020 for U.S. Appl. No. 16/426,215; 21 pages.
Response to Office Action dated Feb. 24, 2020 filed on Mar. 13, 2020 for U.S. Appl. No. 16/426,215; 8 pages.
Notice of Allowance dated Jun. 24, 2020 for U.S. Appl. No. 16/426,215; 12 pages.

* cited by examiner

CURRENT SENSOR INTEGRATED CIRCUIT WITH A DUAL GAUGE LEAD FRAME

FIELD

This disclosure relates generally to current sensor integrated circuits (ICs) with a dual gauge lead frame for high current applications.

BACKGROUND

Some current sensor integrated circuits include one or more magnetic field sensing elements in proximity to an integrated current-carrying primary conductor. The magnetic field sensing elements generate an output signal having a magnitude proportional to the magnetic field induced by the current through the conductor. The level of current to be measured can dictate aspects of the primary conductor, such as material and dimensions.

In applications in which the primary conductor can be at a relatively high voltage, safety specifications require that a certain electrical isolation be maintained between the primary conductor and other parts of the circuitry (e.g., signal leads coupled to an external system to which the sensor output signal is communicated). For example, safety specifications can dictate a minimum "creepage" that refers to the shortest distance between two conductive parts along the surface of any insulation material common to the two conductive parts. The creepage requirement is based on the distance necessary to withstand a given working voltage (i.e., the highest voltage level that insulation under consideration can be subjected to when the current sensor is operating in normal use).

SUMMARY

Described herein are structures and manufacturing methods directed towards providing current sensor integrated circuits (ICs) that meet electrical isolation requirements for high voltage applications and high current applications. The described current sensor IC includes a dual gauge lead frame. Use of the dual gauge lead frame permits independent optimization of the primary conductor and the signal leads while meeting and/or exceeding electrical isolation requirements in a manner that facilitates efficient and cost-effective manufacture.

According to the disclosure, a current sensor integrated circuit (IC) includes a unitary lead frame having a primary conductor and at least one secondary lead spaced from the primary conductor, wherein the primary conductor has a first thickness between an input portion and an output portion between which a current flows and the at least one secondary lead has a second thickness less than the first thickness. The sensor IC further includes a semiconductor die disposed adjacent to the primary conductor and including a magnetic field sensing circuit to sense a magnetic field associated with the current and to generate a secondary signal indicative of the current for coupling to the at least one secondary lead, an insulation structure disposed between the primary conductor and the semiconductor die, and a mold material configured to enclose the semiconductor die, the insulation structure, and a portion of the lead frame to form a package, wherein the primary conductor has a first surface proximate to the semiconductor die and a second surface exposed outside of the package. The mold material encloses a first portion of the at least one secondary lead, wherein a second portion of the at least one secondary lead is exposed outside of the package and has the second thickness.

Features may include one or more of the following individually or in combination with other features. During manufacture, the primary conductor can be attached to the at least one secondary lead by a tie bar structure disposed outside of the package. The first thickness of the primary conductor can be at least approximately 1.25 millimeters. The lead frame can be formed from a unitary sheet having the first thickness. The second thickness of the at least one secondary lead can be approximately 0.38 millimeters. A minimum distance between the exposed second surface of the primary conductor and the second portion of the at least one secondary lead can be at least approximately 8.0 millimeters. A distance of any path between the primary conductor and the semiconductor die through the mold material can be at least approximately 0.4 mm. The insulation structure can include a polyimide film. The insulation structure can further include an adhesive layer. The polyimide film and the adhesive layer can be provided in the form of a tape. The tape can extend beyond a periphery of the semiconductor die. The IC can further include an attachment material to attach the semiconductor die to the insulation structure that can take the form of a non-conductive adhesive. A wire bond can couple the secondary signal to the at least one secondary lead. The primary conductor can include at least one notch substantially vertically aligned with at least one magnetic field sensing element supported by the semiconductor die.

Also described is a method of manufacturing a current sensor integrated circuit (IC) including providing a unitary lead frame sheet having a first substantially uniform thickness, decreasing a thickness of a portion of the unitary lead frame sheet to provide a first portion with the first thickness and a second portion with a thickness that is less than the first thickness, and stamping the lead frame sheet to form a repeating lead frame pattern, wherein each lead frame pattern comprises a primary conductor formed from the first portion and a plurality of secondary leads formed from the second portion, wherein the primary conductor is configured to carry a current and the primary conductor is spaced from the plurality of secondary leads.

Features may include one or more of the following individually or in combination with other features. For each lead frame pattern, the primary conductor can be temporarily attached to the plurality of secondary leads by a tie bar structure comprising a first portion extending between the primary conductor and the plurality of secondary leads and a second portion extending between the plurality of secondary leads. The method can further include attaching a semiconductor die to the primary conductor, electrically coupling one or more of the plurality of secondary leads to the semiconductor die, and enclosing the semiconductor die, a portion of the primary conductor, and a portion of the plurality of secondary leads with a mold material. The method can further include removing the second portion of the tie bar structure. The method can further include trimming and bending the plurality of secondary leads. The method can further include removing the first portion of the tie bar structure. The method can further include attaching an insulation structure between the semiconductor die and the primary conductor. Decreasing the thickness of a portion of the unitary lead frame sheet can include rolling and compression.

DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAILED DESCRIPTION

Figure 1:
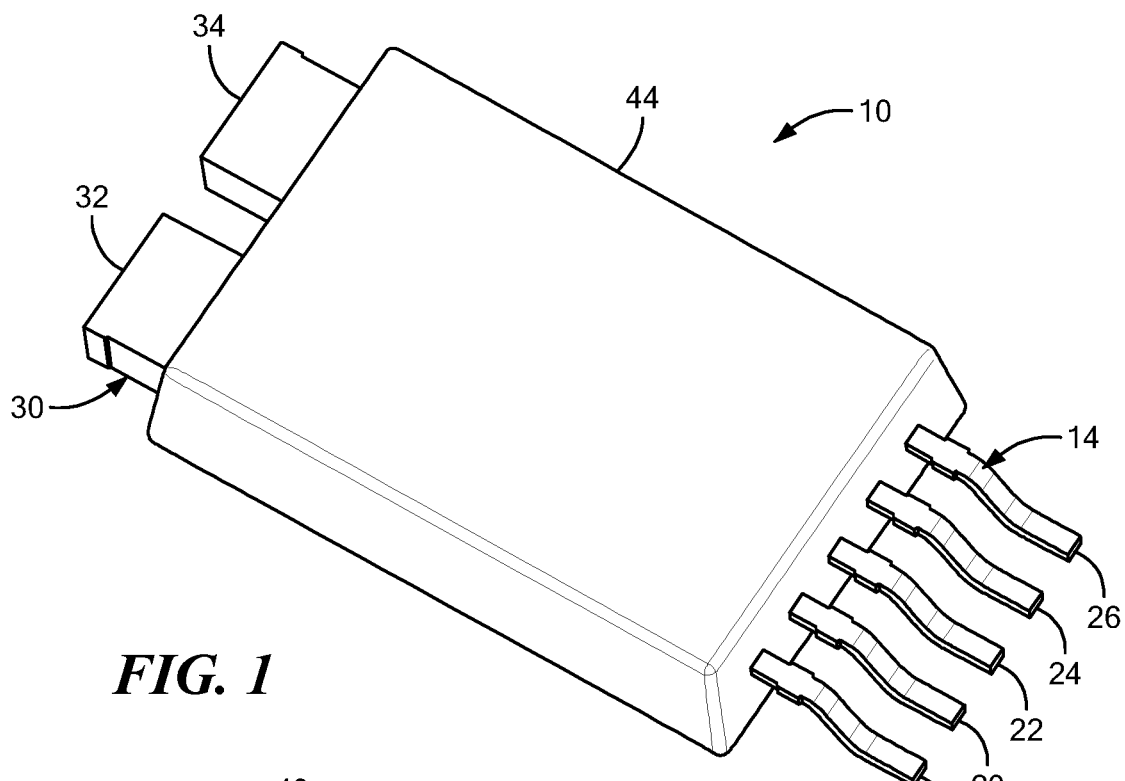
FIG. 1 is an isometric view of a current sensor IC according to aspects of the disclosure.
Figure 1A:
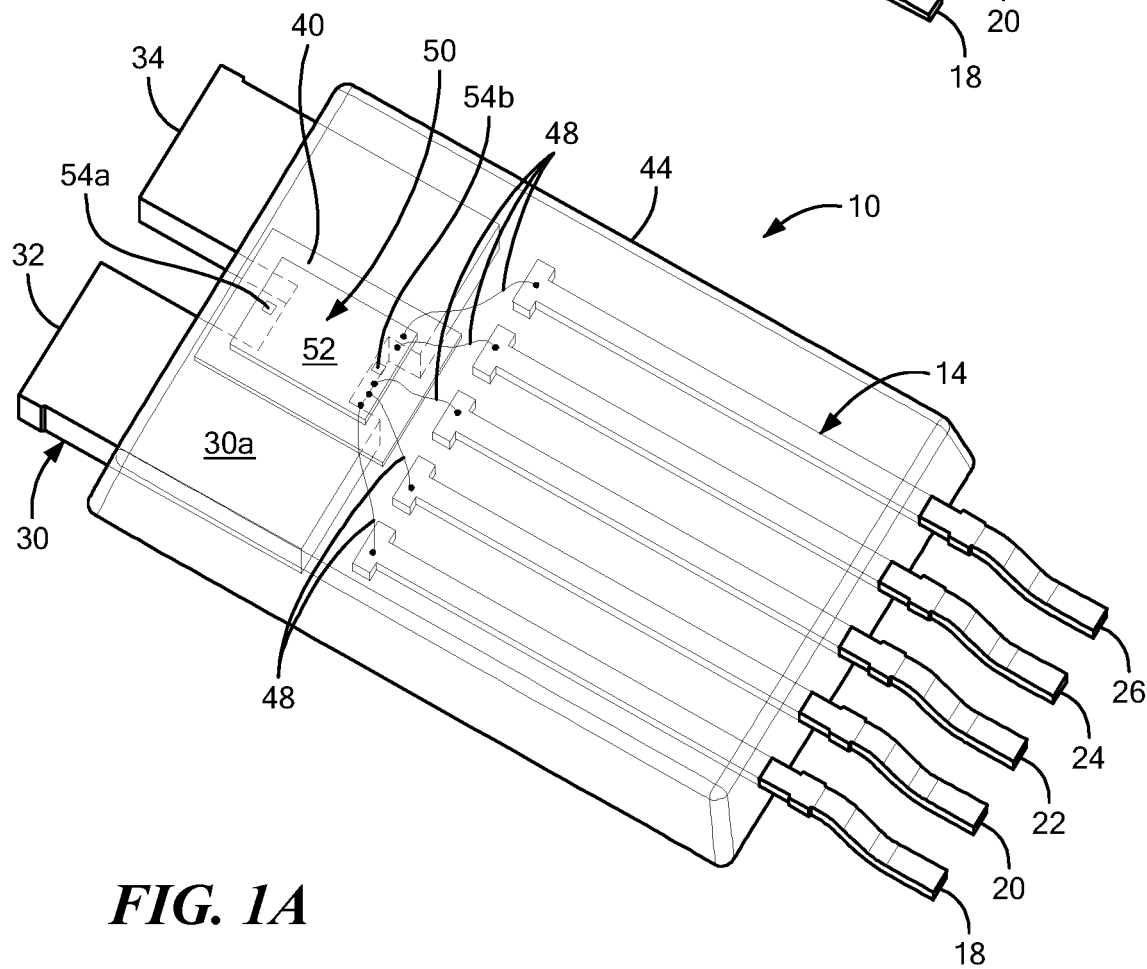
FIG. 1A is a partially transparent view of the current sensor IC of FIG. 1.
Figure 1B:
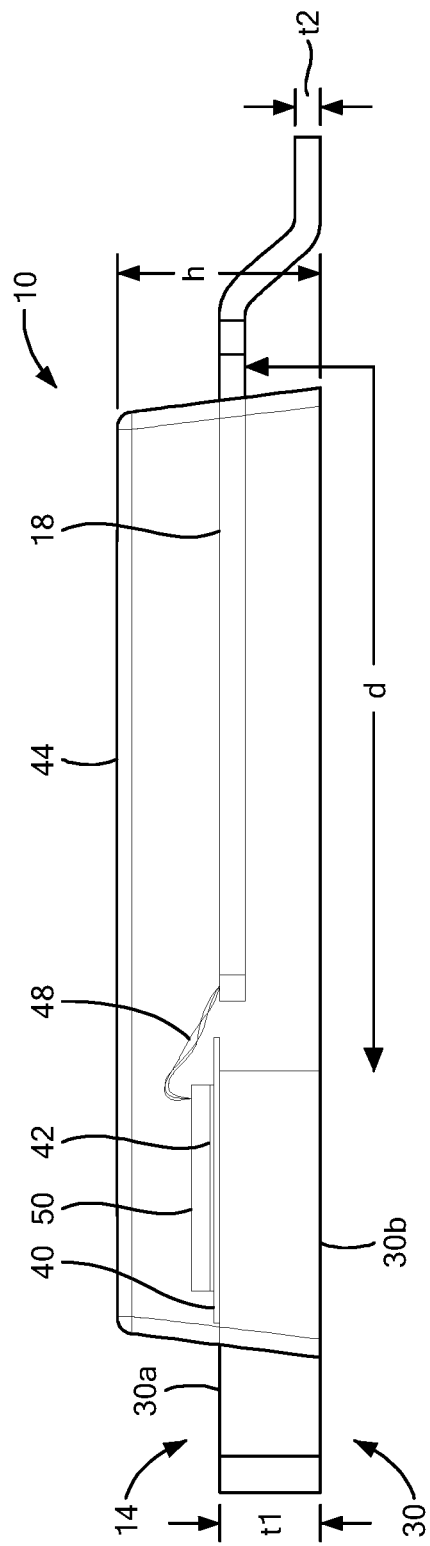
FIG. 1B is a side view of the current sensor IC of FIG. 1A.
Figure 1C:
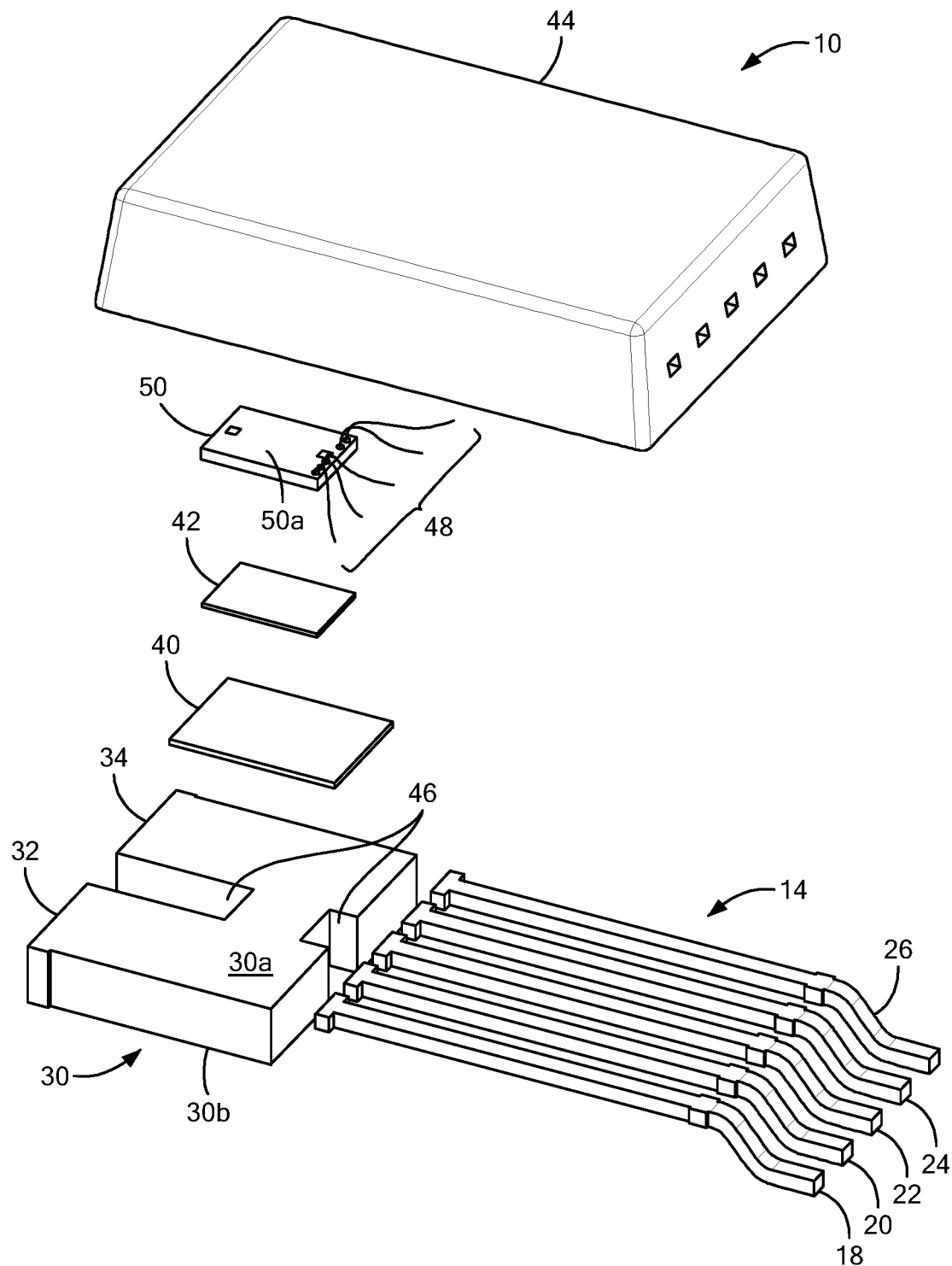
FIG. 1C is an exploded view the current sensor IC of FIG. 1A.

Referring to FIGS. 1-1C, a current sensor integrated circuit (IC) 10 includes a unitary lead frame 14 including a primary conductor 30 and at least one secondary lead 18 (and here a plurality of secondary leads 18-26, which may be referred to collectively as secondary lead(s) 18) spaced from the primary conductor. The primary conductor 30 has an input portion 32 and an output portion 34 between which a current flows in use. As labeled in FIG. 1B, the primary conductor 30 has a first thickness "t1" and the at least one secondary lead 18 has a second thickness "t2" that is less than the first thickness. A semiconductor die 50 is disposed adjacent to the primary conductor 30 and includes a magnetic field sensing circuit 52 to sense a magnetic field associated with the current and to generate a secondary signal indicative of the current for coupling to the secondary lead 18. An insulation structure 40 is disposed between the primary conductor 30 and the semiconductor die 50 and a mold material 44 encloses the die 50, the insulation structure 40, and a portion of the lead frame 14 to form the IC package. The primary conductor 30 has a first surface 30a proximate to the die 50 and a second surface 30b exposed outside of the package. The mold material 44 encloses a first portion of the secondary lead 18 and a second portion of the secondary lead is exposed outside of the package and has the second thickness t2.

According to the disclosure and as described below, during manufacture, the primary conductor 30 is attached to the secondary leads 18-26 by a tie bar structure disposed outside of the package. In some embodiments, the first thickness t1 of the lead frame 14 from which the primary conductor 30 is formed is at least approximately 1.25 millimeters and the lead frame is formed from a unitary sheet of that thickness. The second thickness t2 of the secondary leads 18-26 can be on the order of approximately 0.38 millimeters to 0.5 millimeters and, in an example embodiment, can be 0.38 millimeters. More generally, the first thickness t1 can be between approximately 1.25 millimeters and 1.5 millimeters and, in an example embodiment, can be 1.5 millimeters.

It will be appreciated by those of ordinary skill in the art that although the lead frame 14 is shown to have five secondary leads 18-26, other numbers, dimensions, and configurations of leads are possible. The thickness t2 of the secondary leads 18-26 is such that spacing between adjacent leads can be on the order of 1.5 millimeters (center to center). The greater the thickness t2 of the secondary leads, the more distance would be required between adjacent leads due to manufacturing limitations and such additional distance between leads would disadvantageously enlarge the package width. In embodiments, the mold material 44 can have a length on the order of 14.2 millimeters (from an end adjacent to the primary conductor 30 to an end adjacent to the secondary leads 18-26) and a width (orthogonal to the length) on the order of 9.5 millimeters.

With this arrangement, a dual gauge lead frame 14 (i.e., a lead frame of two thicknesses) permits independent optimization of the primary conductor 30 and the secondary leads 18-26 while meeting and/or exceeding electrical isolation requirements in a manner that facilitates efficient and cost-effective manufacture. While forming the lead frame 14 from a unitary sheet has manufacturing advantages, doing so in a fashion that results in a thick primary conductor 14 and much thinner secondary leads 18-26 presents manufacturing process challenges that are overcome by the described structures and techniques.

The primary conductor 30 can have various shapes and dimensions to accommodate a range of current levels sought to be detected by the current sensor 10 and the desired IC package footprint to accommodate a particular application. The exposed surface 30b of the primary conductor 30 can be soldered, welded, crimped, or otherwise electrically coupled to a surface mount bond pad on a printed circuit board (PCB) or other structure and by its relatively large dimensions, particularly its thickness of t1, permits a relatively high current range level to be detected by the current sensor 10, such as on the order of 400 amps. In use, a current flow is established through the primary conductor 30 between input and output portions 32, 34, respectively.

As can be seen in FIG. 1B, a minimum distance "d" between the exposed second surface 30b of the primary conductor 30 and the exposed second portion of the secondary lead 18 (i.e., the creepage) can be at least approximately 8.0 millimeters and in some embodiments, the creepage "d" can be approximately 10.0 millimeters. Meeting such a creepage rating can be facilitated by having the exposed portion of the secondary leads 18-26 exit the package 44 at an intermediate position along the height "h" of the package body. This arrangement is on contrast to certain other types of surface mount leads that exit a package on the bottom package surface for example.

Still referring to FIG. 1B, a minimum distance of any path between the primary conductor 30 and any secondary voltage level structure (e.g., the semiconductor die 50 or secondary lead 18) through the mold material 44 (i.e., the clearance) can be at least approximately 0.4 millimeters. Meeting such a clearance rating can be facilitated by use of insulation structure 40 and, in particular, by having the insulation structure overhang the semiconductor die (extend beyond the periphery of the semiconductor die) in all directions.

Insulation structure 40 is provided to electrically isolate the current conductor 30 from the semiconductor die 50. The distance by which the insulation 40 overhangs the die 50 to achieve a desired clearance, such as 0.4 mm, may vary depending on the dimensions and relative placement of the die 50, primary conductor 30, wire bonds 48 and tolerances, for example.

The overall size and shape of the insulation structure 40 varies with the size/shape of the die 50 and underlying current conductor 30. In the illustrated construction, the insulation structure 40 has a substantially rectangular shape. The substantially rectangular periphery of the insulation structure extends beyond a smaller substantially rectangular periphery of the die 50 by at least an amount sufficient to achieve the minimum 0.4 mm path length (after tolerancing).

The insulation structure 40 can comprise an organic polymer such as polyimide, or an oxide insulating material like silicon dioxide in the form of a glass sheet, or ceramic. In some embodiments, insulation structure 40 comprises a polyimide film and may further include an adhesive layer. Such an insulation structure 40 can take the form of a tape for example and more than one layer of tape can be used to provide the insulation structure. Additional details of insulation structure 40 may be found in U.S. Pat. No. 8,907,437, entitled "Reinforced Isolation for Current Sensor with Magnetic Field Transducer," issued on Dec. 9, 2014 and assigned to the Assignee of the subject application, which patent is hereby incorporated herein by reference in its entirety.

An attachment mechanism 42 may be provided to secure the die 50 to the insulating tape 40 and may take various forms of non-conductive adhesive, such as wafer backside coating or epoxy, as non-limiting examples. Other types of attachment mechanism 42 can include a non-conductive epoxy and, in some embodiments, a combination of wafer backside coating and non-conductive epoxy may be used.

The magnetic field sensing circuit 52 supported by the semiconductor die 50 includes one or more magnetic field sensing elements, and here elements 54*a* and 54*b*. As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

In operation, when a current flows through the primary conductor 30, magnetic field sensing elements 54*a*, 54*b* convert the sensed magnetic field into a proportional voltage. An output signal based on that voltage is provided at one or more of the secondary leads 18-26 as will be explained further in connection with the example magnetic field sensing circuit of FIG. 6.

The magnetic field sensing circuit 52 is electrically coupled to one or more of secondary leads 18-26 by an interconnect 48. In the illustrated embodiment, interconnect 48 takes the form of wire bonds and the die 50 is positioned over the primary conductor 30 in a "die up" configuration in which the magnetic field sensing elements 54*a*, 54*b* are supported on a die surface 50*a* distal from the primary conductor 30. In order to accommodate thermosonic bonding of the wire bonds 48, bond pads can be provided on the die surface 50*a* and copper secondary signal leads 18-26 can be plated with silver or other noble metal (e.g., gold or platinum) to prevent copper oxidation.

In embodiments, and as labeled in FIG. 1C, the primary conductor 30 may have at least one notch 46 substantially vertically aligned with the magnetic field sensing element 54*a*, 54*b*. It will be appreciated that additional notches and sensing elements may be provided. Notch(es) 46 can concentrate the magnetic field on the sensing elements 54*a*, 54*b*. For example, as current flows through the primary conductor 30, having magnetic field sensing elements 54*a*, 54*b* positioned to the side of the conductor (rather than directly over the conductor) results in magnetic field with component perpendicular to the die 50 such that sensing elements 54*a*, 54*b* may be planar Hall effect elements. In other embodiments, the magnetic field sensing element or elements may be positioned directly over the primary current conductor 30 to sense magnetic field components parallel to the surface of die 50, in which case sensing elements such as a vertical Hall element, a GMR, TMR, or AMR element may be used.

The non-conductive package material 44 may be formed by transfer molding from a plastic material that has insulation properties and thus, may alternatively be referred to as a plastic or mold material.

Features of the lead frame 14 specifically, and of the current sensor 10 generally, will be explained further in connection with following figures that illustrate the current sensor at various stages of fabrication.

Figure 2:
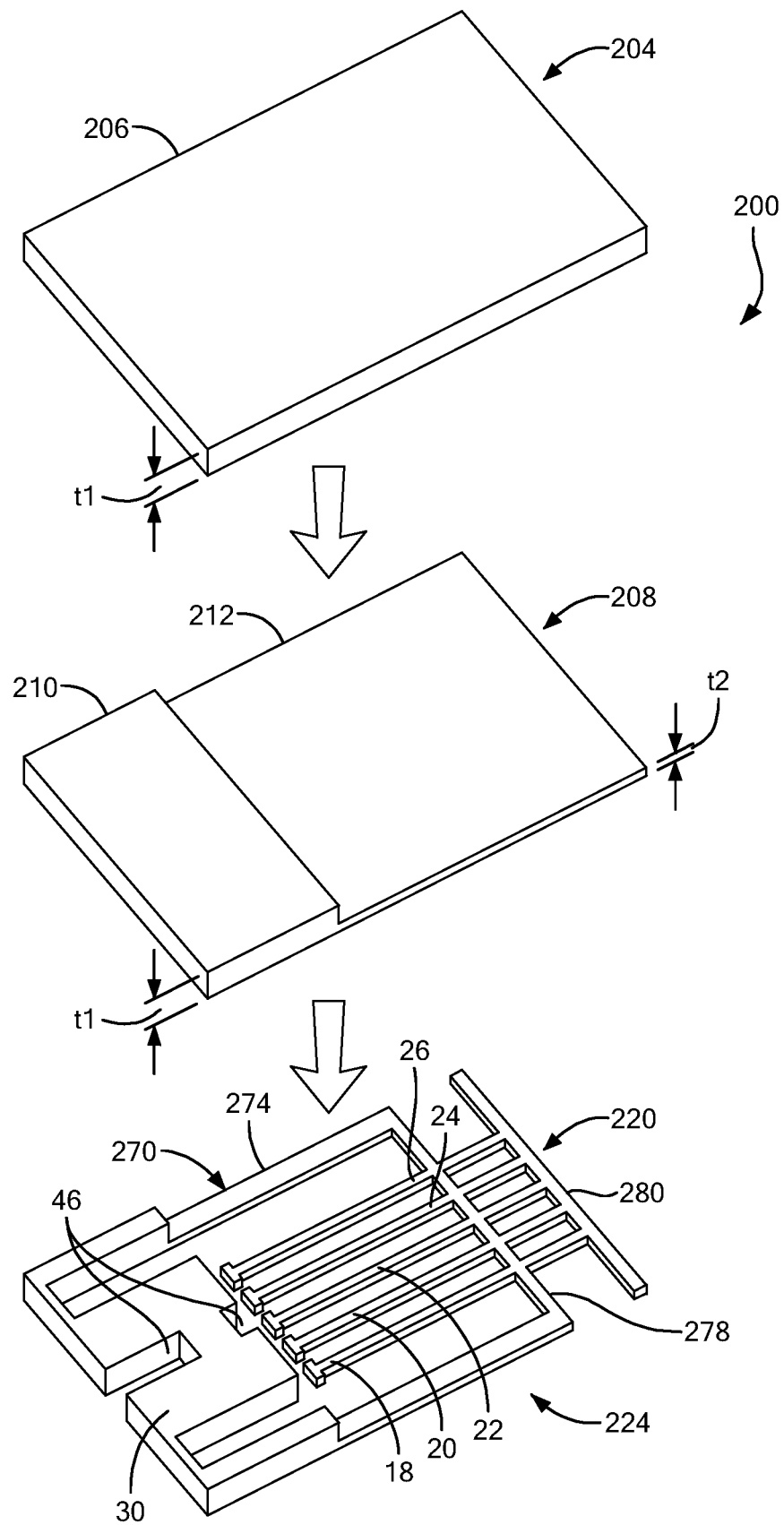
FIG. 2 illustrates an example fabrication process for providing a lead frame of the current sensor IC of FIG. 1 according to aspects of the disclosure.

Referring to the views of FIG. 2, steps 200 for fabricating a lead frame 224 that can be the same as or similar to lead frame 14 start at view 204 with a unitary sheet 206 comprising a conductive material having a substantially uniform thickness t1. The thickness t1 of the sheet 206 can be the same as thickness t1 in FIG. 1B.

Various materials are possible for providing sheet 206. The conductive material of sheet 206 may comprise any suitably strong and conductive material, such as copper or copper alloy or Aluminum.

At view 208, a portion 212 of the sheet 206 has its thickness decreased from thickness t1 to a thickness t2. Thus, the resulting structure has a first portion 210 of the first thickness t1 and a second portion 212 having the second thickness t2. The thickness t2 of the sheet 206 can be the same as thickness t2 in FIG. 1B.

Various techniques are possible for decreasing the thickness of lead frame portion 212. As non-limiting examples, rolling and compression can be used. Milling or stamping may also be used.

Figure 3:
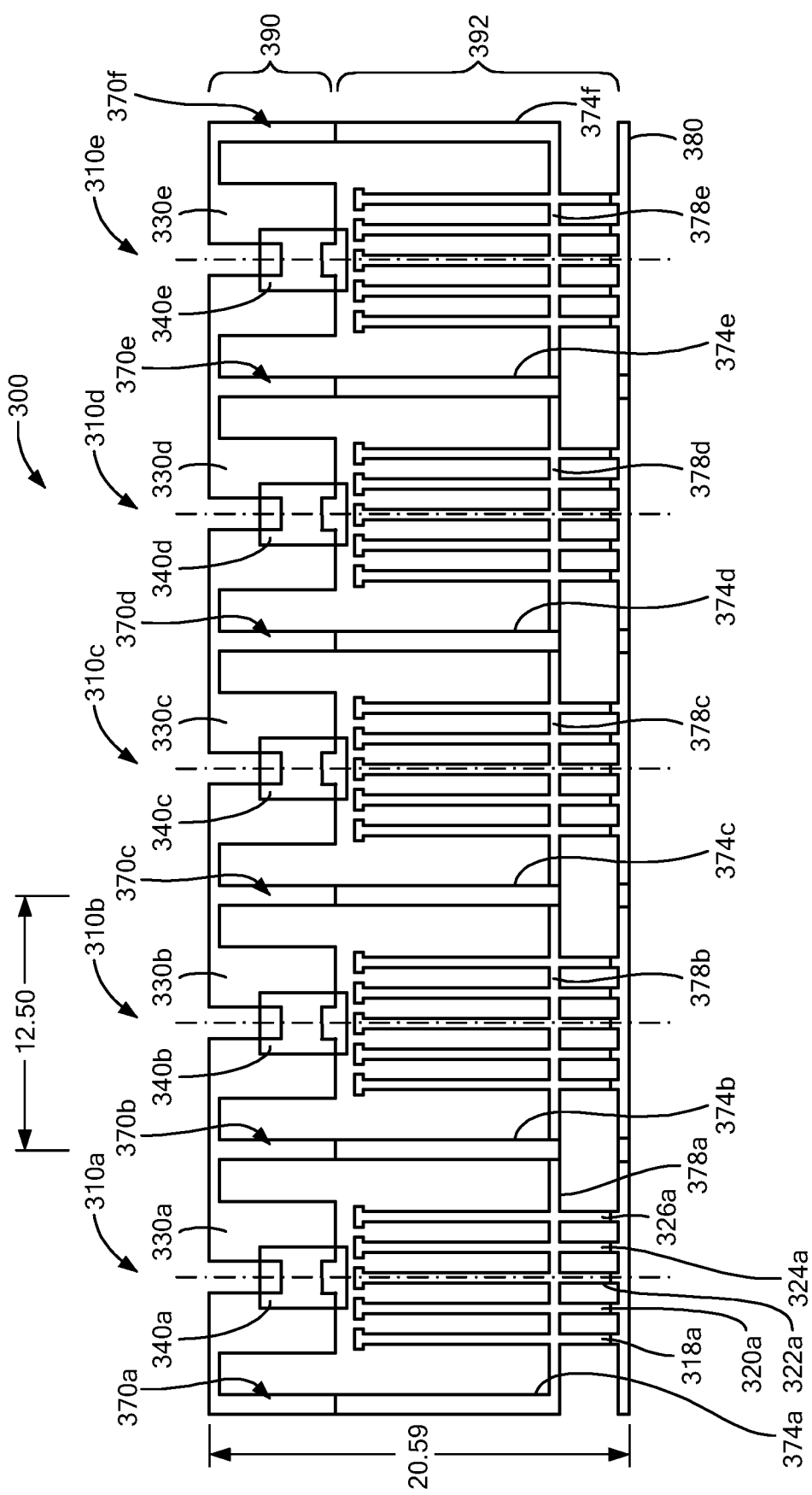
FIG. 3 illustrates a plurality of lead frames of the type of FIG. 2 according to aspects of the disclosure.

At view 220, the dual thickness structure is stamped to form a lead frame 224. In actuality, a plurality of lead frames are formed from a single unitary lead frame sheet as shown in FIG. 3. However, for simplicity of illustration, a single lead frame 224 is shown in view 220 of FIG. 2.

It will be appreciated by those of ordinary skill in the art that while stamping is one process that can be used to form the lead frame features, other techniques may alternatively be used, such as etching, milling and/or laser processes as non-limiting examples.

Lead frame 224 includes primary conductor 30 formed from the first, thicker lead frame portion 210 and a plurality of secondary leads 18-26 formed from the second, thinner portion 212. Lead frame 224 can include notches 46, as shown. A tie bar 280 can be coupled to ends of the secondary leads 18-26, as shown.

The primary conductor 30 is spaced from the plurality of secondary leads 18-26 as is necessary to provide electrical isolation between primary and secondary portions of the current sensor in the final package. It will be appreciated by those of ordinary skill in the art that manufacture of the resulting current sensor from spaced lead frame portions of relatively significantly different thicknesses t1, t2 presents manufacturing challenges. In other words, since the primary conductor 30 and secondary leads 18-26 must be separated in order to provide electrical isolation, such separation would cause the two pieces to fall apart making subsequent steps impossible.

In order to overcome these challenges, the primary conductor 30 is temporarily attached to the plurality of secondary leads 18-26 by a tie bar structure 270 that includes a first tie bar portion 274 that extends between the primary conductor 30 and the secondary leads 18-26, and a second dambar portion 278 extending between the plurality of secondary leads, as shown. Dambars are sometimes used to stop a mold compound from flowing between leads. The described tie bar structure 270 serves the additional purpose of holding the lead frame 224 securely together and stationary during the remainder of the fabrication process.

Figure 4:
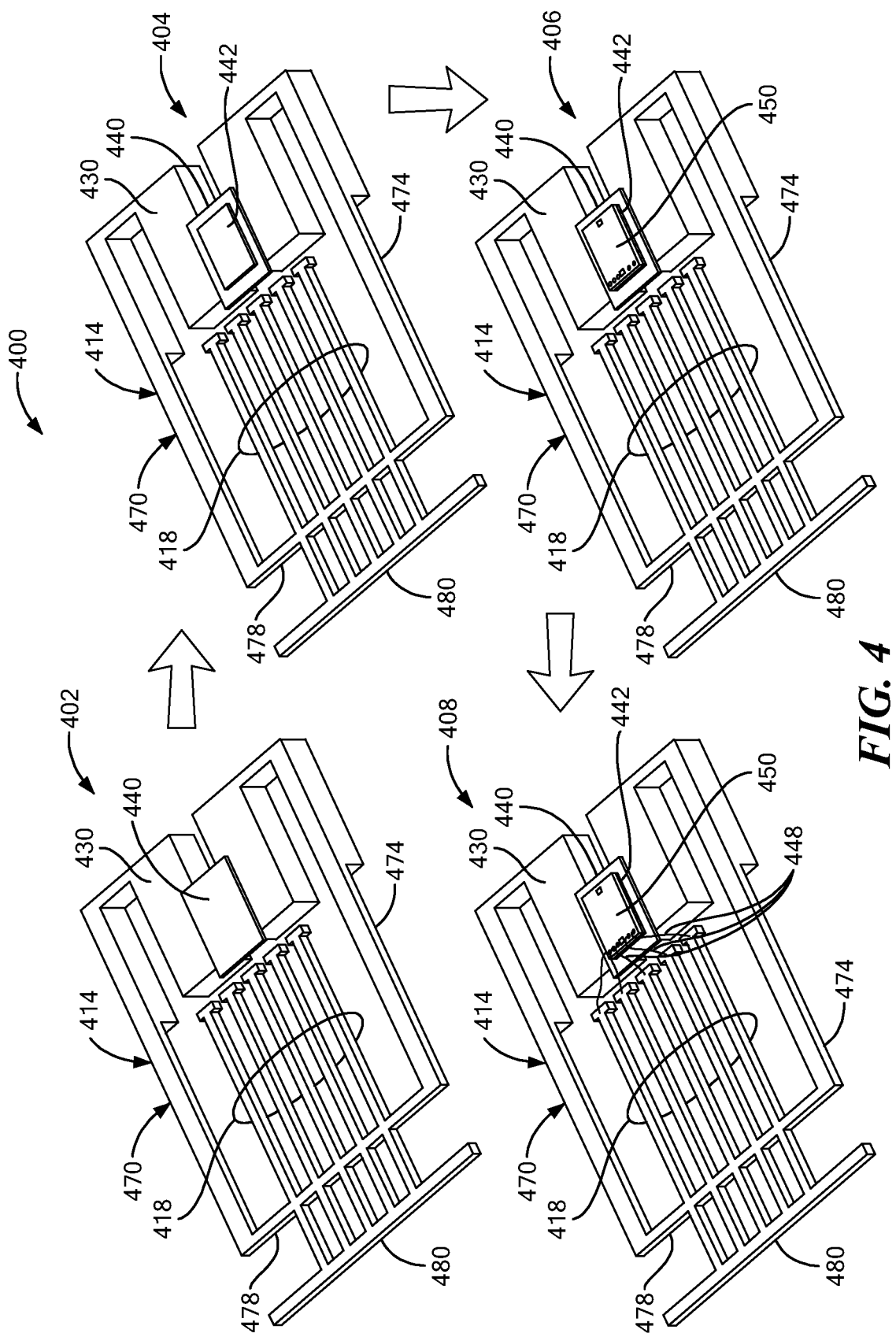
FIG. 4 illustrates an example front end fabrication process for a current sensor IC according to aspects of the disclosure.
Figure 5:
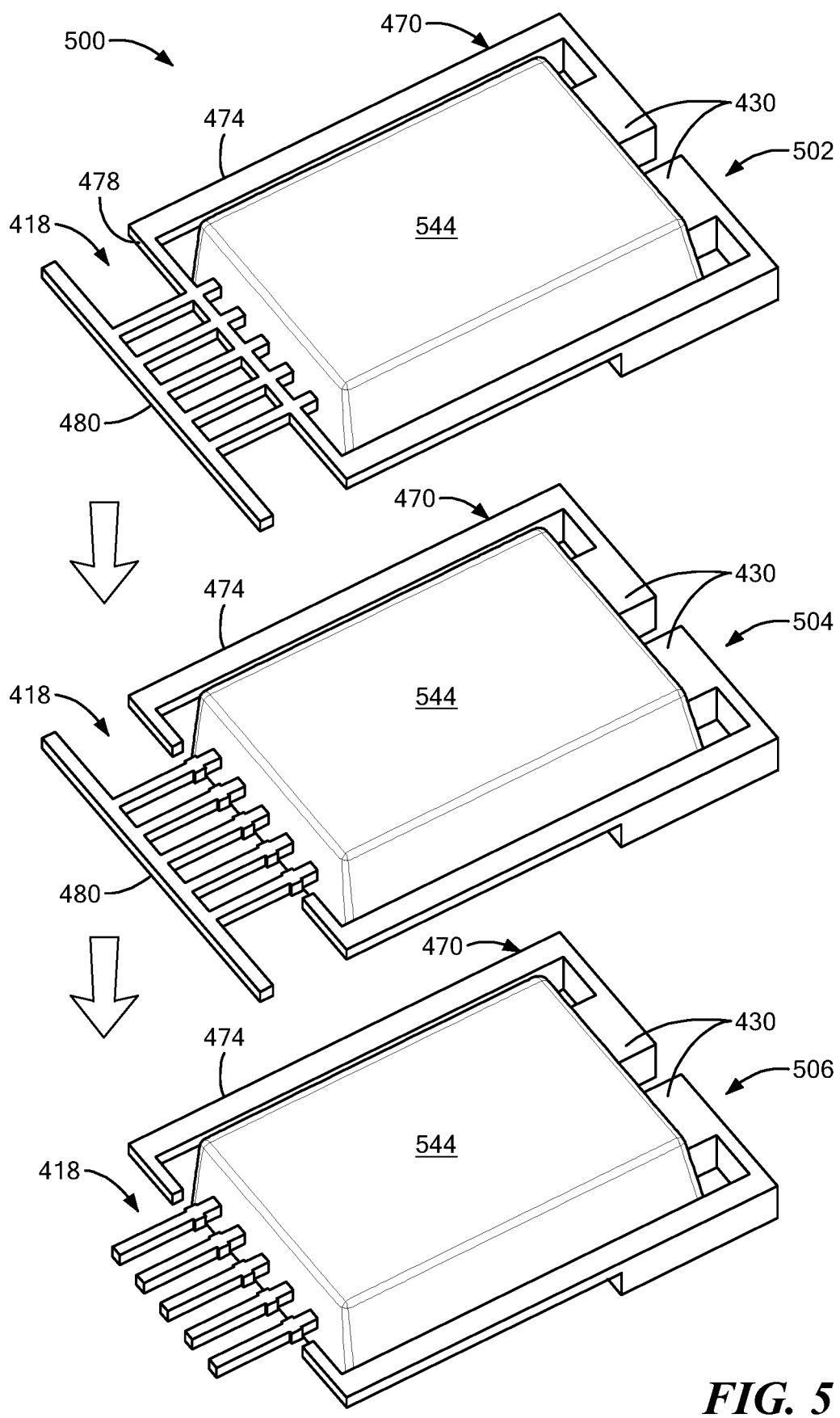
FIG. 5 illustrates an example back end fabrication process for a current sensor IC according to aspects of the disclosure.

Further progression of manufacture of current sensors according to the disclosure is shown in FIGS. 4 and 5. Suffice it to say here that once the current sensor is assembled, the tie bar structure 270 is removed to singulate sensors as will be described.

Referring also to FIG. 3, a lead frame sheet 300 includes a plurality of lead frames 310a-310e as can be formed from a single lead frame sheet like the dual thickness sheet shown in view 206 of FIG. 2. Thus, lead frames 310a-310e are formed from a sheet having thicker portions 390 and thinner portions 392 that can be formed and have the thicknesses t1 and t2, respectively, as explained above.

While five lead fames 310a-310e are shown in the view of FIG. 3, it will be appreciated that various numbers of lead frames can be formed from the single unitary sheet with thicker and thinner portions 390, 392, respectively. Each lead frame 310a-310e can be the same as or similar to lead frames 14, 224 and thus, can include a primary conductor 330a-330e spaced from respective secondary leads that can be the same as or similar to secondary leads 18-26 and that are labeled 318a-326a for lead frame 310a. A tie bar 380 can be coupled between the secondary leads, as shown. An insulation structure 340a-340e is shown disposed over a portion of each respective primary conductor 310a-310e and may be the same as or similar to insulation structure 40 described above.

Each lead frame 310a-310e can have a tie bar structure 370a-370e that is the same as or similar to tie bar structure 270 (FIG. 2) and adjacent lead frames 310a-310e can share portions of the tie bar structures. Each tie bar structure 370a-370e includes first tie bar portions 374 extending between the respective primary conductor 330a-330e and the secondary leads and a second dambar portion 378a-378e extending between the respective secondary leads, as shown. The first portions 374 of adjacent tie bar structures can be shared. For example, tie bar structure 370a of lead frame 310a includes portion 374a extending along one side of the lead frame to the secondary leads 318a-326a and portion 374b extending along the other side of the lead frame to the secondary leads and adjacent lead frame 310b shares portion 374b. Thus, tie bar structure 370b of lead frame 310b includes portion 374b extending along one side of the lead frame to the respective secondary leads (and shares this tie bar portion 374b with lead frame 310a) and a portion 374c extending along the other side of the lead frame to the secondary leads.

Referring to FIG. 4, further manufacturing steps 400 are shown in views 402, 404, 406, and 408. The lead frame 414 can be the same as or similar to lead frame 14 (FIG. 1) and/or lead frame 224 (FIG. 2), but with the structure flipped over. The lead frame 414 includes a primary conductor 430 that can be formed from a thicker portion of the lead frame sheet (e.g., such as portion 210 in FIG. 2) and secondary leads, labelled collectively as secondary leads 418 and formed from a thinned portion of the lead frame (e.g., such as portion 212 of FIG. 2). The thicknesses of primary conductor 430 can be the thickness t1 as described above and the thickness of secondary leads 418 can be thickness t2 as described above. Primary conductor 430 is spaced from secondary leads 418 for electrical isolation purposes, as shown.

A tie bar structure 470 of the lead frame includes a first tie bar portion 474 that extends from the primary conductor 430 to the secondary leads 418 and a second dambar portion 478 that extends between the secondary leads. A tie bar 480 can be coupled to the end of the secondary leads 418, as shown.

An insulation structure 440 (that can be the same as or similar to insulation structure 40) is positioned over the primary conductor 430 and can be provided in the form of a tape that is adhesive and can be securely applied directly onto the primary conductor.

At view 404, a die attachment mechanism 442 is positioned over the insulation structure 440 as shown. As noted above in connection with attachment mechanism 42, the attachment mechanism can take the form of various non-conductive adhesives, including wafer backside coating and/or epoxy.

At view 406, a semiconductor die 450 that can be the same as or similar to die 50, can be attached to the die attachment mechanism 442, as shown. The insulation structure 440 can extend beyond a periphery of the die 450 and in that way, increase the clearance distance beyond what is otherwise achievable. In particular, insulation structure 440 extends beyond the primary conductor 430 proximal to the secondary leads 418 by at least 0.4 mm in order to provide enough clearance between primary conductor 430 and wire bonds 448. At view 408, the die 450 is electrically coupled to secondary leads 418, here by wire bonds 448, as shown.

Figure 5A:
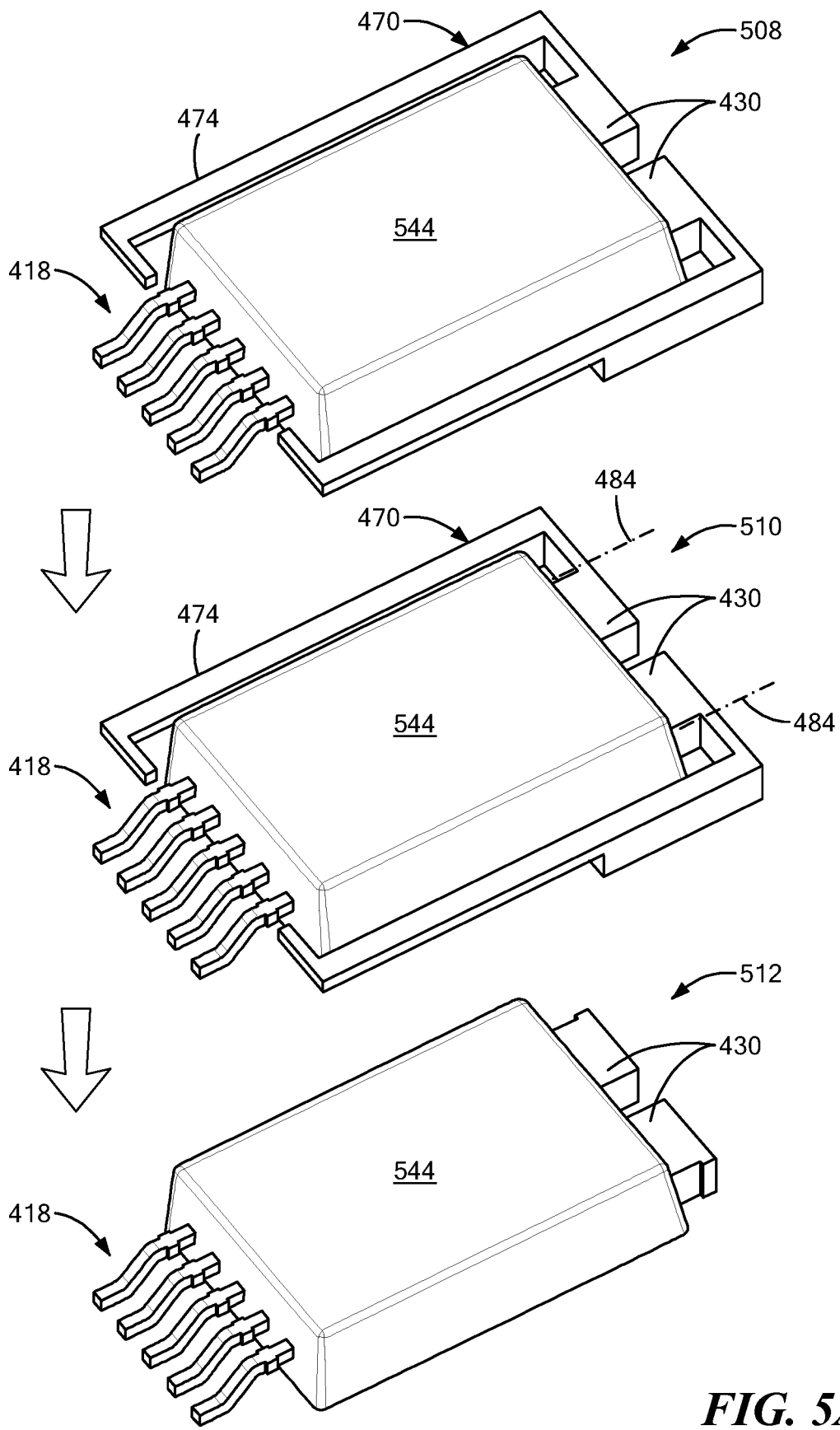
FIG. 5A illustrates further steps of the back end fabrication process of FIG. 5.

Referring also to FIGS. 5 and 5A, further manufacturing steps 500 of current sensors according to the disclosure are shown in views 502, 504, 506, 508, 510, 512. View 502 shows the structure of view 408 (FIG. 4) further including overmolding by a mold material 544. As noted above in connection with mold material 44, various process techniques are possible for forming the mold material, such as transfer molding. The mold material 544 encloses the semiconductor die 450, a portion of the primary conductor 430, and a portion of the secondary leads 418, as shown.

The view 502 illustrates ends of the primary conductor 530 extending from the mold material 544, exposed portions of the secondary leads 518 extending out of an opposite end of the mold material 544, and tie bar 480 coupled to the secondary leads. Also shown is the tie bar structure 470 including first portion 474 extending from the primary conductor 430 to the secondary leads 418 and a second dambar portion 478 extending between the secondary leads.

At view 504, the dambar portion 478 of the tie bar structure 470 is removed. At view 506, the secondary leads 418 are trimmed, thereby removing the tie bar 480.

Referring also to FIG. 5A, at view 508, the secondary leads 418 are bent. The example secondary leads 418 are bent to provide surface mount connections. It will be appreciated by those of ordinary skill in the art however, that other types of secondary lead bending can be performed to accommodate different type of mounting, such as mounting through plated printed circuit board through-holes.

At view 510, lines 584 illustrate lines along which the package can be singulated and view 512 shows the result of such singulation whereby the portion 474 of the tie bar structure 470 is removed, thereby yielding the final packaged current sensor IC.

Figure 6:
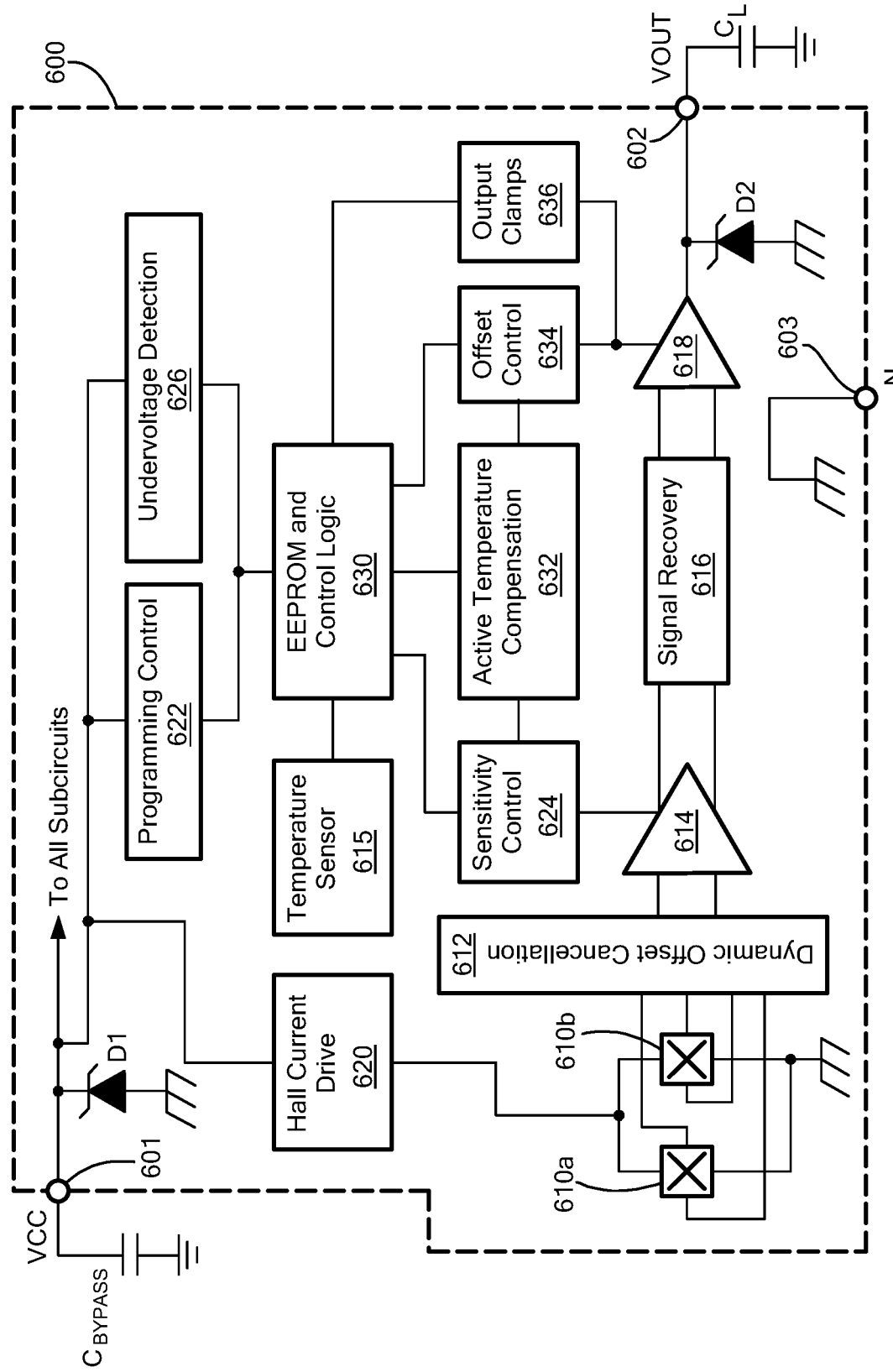
FIG. 6 is a schematic block diagram of an example current sensor IC according to aspects of the disclosure.

Referring to FIG. 6, a schematic block diagram of an example current sensor 600 that can be the same as or similar to current sensor 10 as can be manufactured as described above, includes one or more magnetic field sensing elements, and here two sensing elements 610a, 610b. Sensing elements 610a, 610b can be Hall effect elements or other magnetic field transducer element types. It will be appreciated that sensor 600 is presented as a non-limiting example of circuitry suitable for sensors 10, 600 according to the disclosure.

Use of two or more sensing elements 610a, 610b permits differential magnetic field sensing, as may be advantageous to improve immunity (i.e., insensitivity) to common-mode stray magnetic fields. While differential sensing may be implemented, for example using two sensing elements as shown, in some embodiments, the current sensor can include only a single sensing element. Furthermore, it will also be appreciated that differential sensing can be implemented using more than two sensing elements and can include the use of sensing elements arranged in a bridge configuration.

Example current sensor 600 has three pins in this embodiment, including a VCC (supply voltage) pin 601, a VOUT (output signal) pin 1002, and a GND (ground) pin 603. The VCC pin 601 is used for the input power supply or supply voltage for the current sensor 600. A bypass capacitor, $C_{BYPASS}$, can be coupled between the VCC pin 601 and ground. The VCC pin 601 can also be used for programming the current sensor 600. The VOUT pin 602 is used for providing the output signal for the current sensor 600 to circuits and systems (not shown) and can also be used for programming. An output load capacitance $C_L$ is coupled between the VOUT pin 602 and ground. The example current sensor 600 can include a first diode D1 coupled between the VCC pin 601 and chassis ground and a second diode D2 coupled between the VOUT pin 602 and chassis ground.

Magnetic field signals generated by the magnetic field sensing elements 610a, 610b are coupled to a dynamic offset cancellation circuit 612, which is further coupled to an amplifier 614. The amplifier 614 is configured to generate an amplified signal for coupling to the signal recovery circuit 616. Dynamic offset cancellation circuit 612 may take various forms including chopping circuitry and may function in conjunction with offset control 634 to remove offset that can be associated with the magnetic field sensing elements 610a, 610b and/or the amplifier 614. For example, offset cancellation circuit 612 can include switches configurable to drive the magnetic field sensing elements (e.g., Hall plates) in two or more different directions such that selected drive and signal contact pairs are interchanged during each phase of the chopping clock signal and offset voltages of the different driving arrangements tend to cancel. A regulator (not shown) can be coupled between supply voltage VCC and ground and to the various components and sub-circuits of the sensor 600 to regulate the supply voltage.

A programming control circuit 622 is coupled between the VCC pin 601 and EEPROM and control logic 630 to provide appropriate control to the EEPROM and control logic circuit. EEPROM and control logic circuit 630 determines any application-specific coding and can be erased and reprogrammed using a pulsed voltage. A sensitivity control circuit 624 can be coupled to the amplifier 614 to generate and provide a sensitivity control signal to the amplifier 614 to adjust a sensitivity and/or operating voltage of the amplifier. An active temperature compensation circuit 632 can be coupled to sensitivity control circuit 624, EEPROM and control logic circuit 630, and offset control circuit 634. The offset control circuit 634 can generate and provide an offset signal to a push/pull driver circuit 618 (which may be an amplifier) to adjust the sensitivity and/or operating voltage of the driver circuit. The active temperature compensation circuit 632 can acquire temperature data from EEPROM and control logic circuit 630 via a temperature sensor 615 and perform necessary calculations to compensate for changes in temperature, if needed. Output clamps circuit 636 can be coupled between the EEPROM and control logic 630 and the driver 618 to limit the output voltage and for diagnostic purposes. For example, if the total output range can be from 0V to 5V, for magnetic fields from 0 G to 1000 G, it may be desired to use a clamp at 0.5V for any field below 100 G. For example, it may be known that below 100 G, the sensor 600 does not generate a trustable signal. Hence, if the IC output is 0.5V, it is evident that the measurement is not valid and cannot be trusted. Or clamps at 1V and 4V could be used and the 0-1V and 4-5V ranges can be used for communicating diagnostic information (e.g., 4.5V on the output could indicate "Hall plate is dead" and 0.5V could indicate "Undervoltage VCC detected", etc.). An undervoltage detection circuit 626 can operate to detect an undervoltage condition of the supply voltage level VCC.

It will be appreciated that while FIG. 6 shows an example current sensor 600 primarily as a digital implementation, any appropriate current sensor can be used in accordance with the present disclosure, including both digital, analog, and combined digital and analog implementations.

All references cited herein are hereby incorporated herein by reference in their entirety.

Having described preferred embodiments, it will now become apparent to one of ordinary skill in the art that other embodiments incorporating their concepts may be used. Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

It is felt therefore that these embodiments should not be limited to disclosed embodiments, but rather should be limited only by the spirit and scope of the appended claims.

What is claimed is:

1. A current sensor integrated circuit (IC) comprising:
a unitary lead frame comprising a primary conductor and at least one secondary lead spaced from the primary conductor, wherein the primary conductor has a first thickness between an input portion and an output portion between which a current flows and wherein the at least one secondary lead has a second thickness less than the first thickness;

a semiconductor die disposed adjacent to the primary conductor and comprising a magnetic field sensing circuit to sense a magnetic field associated with the current and to generate a secondary signal indicative of the current for coupling to the least one secondary lead;

an insulation structure disposed between the primary conductor and the semiconductor die; and a mold material configured to enclose the semiconductor die, the insulation structure, and a portion of the lead frame to form a package, wherein the primary conductor has a first surface proximate to the semiconductor die and a second surface exposed outside of the package, wherein the mold material encloses a first portion of the at least one secondary lead, wherein a second portion of the at least one secondary lead is exposed at an intermediate height of an outside edge of the package and has the second thickness.

2. The current sensor IC of claim 1 wherein, during manufacture, the primary conductor is attached to the at least one secondary lead by a tie bar structure disposed outside of the package.

3. The current sensor IC of claim 1, wherein the first thickness is at least approximately 1.25 millimeters.

4. The current sensor IC of claim 3, wherein the lead frame is formed from a unitary sheet having the first thickness.

5. The current sensor IC of claim 3, wherein the second thickness is approximately 0.38 millimeters.

6. The current sensor IC of claim 1, wherein a minimum distance between the exposed second surface of the primary conductor and the second portion of the at least one secondary lead is at least approximately 8.0 millimeters.

7. The current sensor IC of claim 1, wherein a minimum distance of any path between the primary conductor and the semiconductor die through the mold material is at least approximately 0.4 mm.

8. The current sensor IC of claim 1, wherein the insulation structure comprises a polyimide film.

9. The current sensor IC of claim 8, wherein the insulation structure further comprises an adhesive layer.

10. The current sensor IC of claim 9, wherein the polyimide film and the adhesive layer are provided in the form of a tape.

11. The current sensor IC of claim 10, wherein the tape extends beyond a periphery of the semiconductor die.

12. The current sensor IC of claim 11, wherein the tape extends beyond the primary conductor adjacent to the secondary leads by 0.4 mm.

13. The current sensor IC of claim 1, further comprising an attachment material to attach the semiconductor die to the insulation structure.

14. The current sensor IC of claim 13, wherein the attachment material comprises a non-conductive adhesive.

15. The current sensor IC of claim 1, further comprising a wire bond to couple the secondary signal to the least one secondary lead.

16. The current sensor IC of claim 1, wherein the primary conductor comprises at least one notch substantially vertically aligned with at least one magnetic field sensing element supported by the semiconductor die.

17. A method of manufacturing a current sensor integrated circuit (IC) comprising:

providing a unitary lead frame sheet having a first substantially uniform thickness;

decreasing a thickness of a portion of the unitary lead frame sheet to provide a first portion with the first thickness and a second portion with a thickness that is less than the first thickness; and stamping the lead frame sheet to form a repeating lead frame pattern, wherein each lead frame pattern comprises a primary conductor formed from the first portion and a plurality of secondary leads formed from the second portion, wherein the primary conductor is configured to carry a current and the primary conductor is spaced from the plurality of secondary leads.

18. The method of claim 17, wherein, for each lead frame pattern, the primary conductor is temporarily attached to the plurality of secondary leads by a tie bar structure comprising a first portion extending between the primary conductor and the plurality of secondary leads and a second dambar portion extending between the plurality of secondary leads.

19. The method of claim 18, further comprising:

attaching a semiconductor die to the primary conductor;

electrically coupling one or more of the plurality of secondary leads to the semiconductor die; and enclosing the semiconductor die, a portion of the primary conductor, and a portion of the plurality of secondary leads with a mold material.

20. The method of claim 18, further comprising removing the second portion of the tie bar structure.

21. The method of claim 18, further comprising trimming and bending the plurality of secondary leads.

22. The method of claim 18, further comprising removing the first portion of the tie bar structure.

23. The method of claim 19, further comprising attaching an insulation structure between the semiconductor die and the primary conductor.

24. The method of claim 17, wherein decreasing the thickness of a portion of the unitary lead frame sheet comprises rolling and compression.

* * * * *